United States Patent
Okuno (10) Patent No.: US 10,700,235 B2
(45) Date of Patent: *Jun. 30, 2020

(54) PRODUCTION METHOD FOR GROUP III NITRIDE SEMICONDUCTOR

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/116,574

(22) Filed: Aug. 29, 2018

(65) Prior Publication Data
US 2019/0074405 A1 Mar. 7, 2019

(30) Foreign Application Priority Data
Sep. 7, 2017 (JP) .................. 2017-172069

(51) Int. Cl.
| H01L 33/00 | (2010.01) |
| C23C 16/56 | (2006.01) |
| C23C 16/30 | (2006.01) |
| C30B 25/18 | (2006.01) |
| C23C 16/20 | (2006.01) |
| C23C 16/455 | (2006.01) |
| C23C 16/02 | (2006.01) |
| C30B 29/40 | (2006.01) |

(Continued)

(52) U.S. Cl.
CPC ...... *H01L 33/0079* (2013.01); *C23C 16/0281* (2013.01); *C23C 16/20* (2013.01); *C23C 16/303* (2013.01); *C23C 16/45502* (2013.01); *C23C 16/56* (2013.01); *C30B 25/183* (2013.01); *C30B 29/403* (2013.01); *H01L 33/007* (2013.01); *H01L 33/12* (2013.01); *H01L 33/32* (2013.01)

(58) Field of Classification Search
CPC ... H01L 33/0079; H01L 33/007; H01L 33/12; H01L 33/32; C23C 16/303; C23C 16/56
See application file for complete search history.

(56) References Cited

U.S. PATENT DOCUMENTS

| 6,391,748 | B1 * | 5/2002 | Temkin | .................. C30B 23/02 257/E21.127 |
| 6,790,695 | B2 * | 9/2004 | Ogihara | ..................... B41J 2/45 438/33 |

(Continued)

FOREIGN PATENT DOCUMENTS

| JP | 2011-151393 A | 8/2011 |
| JP | 57-33258 B2 | 6/2015 |

(Continued)

*Primary Examiner* — Savitri Mulpuri
(74) *Attorney, Agent, or Firm* — McGinn IP Law Group, PLLC (57) ABSTRACT

The method comprises: forming an Al layer or Al droplets on a surface of a substrate by flowing an organic metal gas containing Al without flowing an ammonia gas; forming an AlN buffer layer on the Al layer or Al droplets by flowing the organic metal gas containing Al and the ammonia gas, the Al layer or Al droplets remaining as a metal under the AlN buffer layer; forming the Group III nitride semiconductor on the AlN buffer layer; and peeling the Group III nitride semiconductor in a place of the Al layer or Al droplets from the substrate.

16 Claims, 6 Drawing Sheets

(51) Int. Cl.
  *H01L 33/32*  (2010.01)
  *H01L 33/12*  (2010.01)

(56) References Cited

U.S. PATENT DOCUMENTS

| | | | | |
|---|---|---|---|---|
| 7,615,420 | B2* | 11/2009 | Jiang | H01L 21/02381 |
| | | | | 257/E21.121 |
| 8,685,764 | B2* | 4/2014 | Chu | H01L 33/0079 |
| | | | | 257/E33.001 |
| 8,916,400 | B2* | 12/2014 | Huang | H01L 33/007 |
| | | | | 257/98 |
| 9,842,964 | B2* | 12/2017 | Hertkorn | H01L 21/0242 |
| 2008/0102295 | A1* | 5/2008 | Takeuchi | B32B 15/04 |
| | | | | 428/457 |
| 2009/0309126 | A1* | 12/2009 | Okuno | H01L 33/007 |
| | | | | 257/103 |
| 2012/0126241 | A1* | 5/2012 | Okuno | H01L 33/22 |
| | | | | 257/76 |
| 2013/0234150 | A1* | 9/2013 | Huang | H01L 33/10 |
| | | | | 257/76 |
| 2015/0194442 | A1* | 7/2015 | Ishibashi | H01L 21/76251 |
| | | | | 428/137 |
| 2018/0204976 | A1* | 7/2018 | Kim | H01L 31/03522 |
| 2019/0067512 | A1* | 2/2019 | Okuno | C30B 29/403 |

FOREIGN PATENT DOCUMENTS

| | | |
|---|---|---|
| JP | 57-68159 B2 | 8/2015 |
| WO | WO 2011/077748 A1 | 6/2011 |

* cited by examiner

PRODUCTION METHOD FOR GROUP III NITRIDE SEMICONDUCTOR

BACKGROUND OF THE INVENTION

Field of the Invention

The present techniques relate to a production method for a Group III nitride semiconductor.

Background Art

When a Group III nitride semiconductor device is produced, a substrate lift-off method may be used. In the substrate lift-off method, a low temperature growth buffer layer is formed on a sapphire substrate being a growth substrate, and a Group III nitride semiconductor layer is formed on the low temperature growth buffer layer. A support substrate is attached to the Group III nitride semiconductor layer and the growth substrate is peeled off.

Japanese Patent Application Laid-Open (kokai) No. 2011-151393 discloses a technique using a metal buffer layer. Firstly, a metal buffer layer made of scandium is formed by sputtering on a growth substrate, and the metal buffer layer is nitrided in a MOCVD chamber (paragraph [0043]). A Group III nitride semiconductor layer is formed on the nitrided layer. The metal buffer layer is removed by hydrochloric acid. Thus, the growth substrate is peeled off from the Group III nitride semiconductor layer (paragraph [0043]). As the metal buffer layer, chromium, hafnium, zirconium other than scandium may be used (paragraph [0024]). This can form a vertical type semiconductor light-emitting device.

According to the techniques disclosed by Japanese Patent Application Laid-Open (kokai) No. 2011-151393, an nitrided layer such as scandium is not necessarily a buffer layer suitable for forming a Group III nitride semiconductor layer. The Group III nitride semiconductor layer may not be good in crystallinity. Metal such as scandium acts as an impurity in the MOCVD chamber, resulting in an unexpected failure in the Group III nitride semiconductor layer. According to the techniques of Japanese Patent Application Laid-Open (kokai) No. 2011-151393, the substrate is transferred from the sputtering apparatus to the MOCVD chamber. Moreover, it is not easy to peel off the semiconductor layer from the growth substrate. Therefore, the process is complicated, and the cycle time is long.

A high temperature growth buffer layer is preferably used than the conventional low temperature growth buffer layer to grow the Group III nitride semiconductor layer in good crystallinity. However, it is not so easy to form a high quality and high temperature growth buffer layer on the growth substrate.

SUMMARY OF THE INVENTION

The present techniques have been conceived for solving the aforementioned problems involved in conventional techniques. Thus, an object of the present techniques is to provide a method for producing a Group III nitride semiconductor device wherein a high quality high temperature growth buffer layer is formed and the growth substrate is easily peeled off, and a method for producing a device and a substrate.

In a first aspect of the present techniques, there is provided a method for producing a Group III nitride semiconductor. The method comprises forming an Al layer or Al droplets on a surface of a substrate, which is made of a material different from the Group III nitride semiconductor, by flowing an organic metal gas containing Al without flowing an ammonia gas. The method comprises forming an AlN buffer layer on the Al layer or Al droplets by flowing the organic metal gas containing Al and the ammonia gas, the Al layer or Al droplets remaining as a metal under the AlN buffer layer. The method comprises forming the Group III nitride semiconductor on the AlN buffer layer. The method comprises peeling the Group III nitride semiconductor in a place of the Al layer or Al droplets from the substrate. The Group III nitride semiconductor may be naturally peeled off from the substrate when the substrate is taken out of a vapor phase deposition apparatus. Voids may be formed in the Al layer or Al droplets by evaporating Al atoms from the Al layer or Al droplets. In the forming an Al layer or Al droplets, the internal pressure of a vapor phase deposition apparatus may be set to 1 kPa to 19 kPa, the temperature of the substrate may be set to 900° C. to 1,500° C., and an organic metal gas containing Al may be supplied at a flow rate such that Al atoms are uniformly deposited on an entire surface of the substrate. The organic metal gas containing Al may be supplied at a flow rate such that Al atoms generated by decomposition of the organic metal gas containing Al can reach the entire surface from a near side to a far side of the substrate in a gas flow direction. In the forming the Group III nitride semiconductor layer, the internal pressure of the furnace may be set at an atmospheric pressure. In the forming the AlN buffer layer, the internal pressure of the vapor phase deposition apparatus, the temperature of the substrate and the flow rate of the organic metal gas containing Al may be kept at values as same as values at which the Al layer or Al droplets is formed. When the Group III nitride semiconductor is grown on the AlN buffer layer, the Al layer or Al droplets may be kept in a molten state. In the forming the Al layer or Al droplets, the organic metal gas containing Al may be supplied at any rate in a range from $1.0 \times 10^{-4}$ mol/min to $150 \times 10^{-4}$ mol/min. And also the flow rate of the organic metal gas per the area of the cross section perpendicular to a gas flow direction at a position of the substrate may be set at any value in a range from $1.0 \times 10^{-6}$ mol/(min·cm$^2$) to $10 \times 10^{-6}$ mol/(min·cm$^2$). The Group III nitride semiconductor which is grown on the AlN buffer layer may be a light-emitting device. The Group III nitride semiconductor which is peeled off the substrate may be another substrate for a device. The Group III nitride semiconductor may be used as a semiconductor material.

The Group III nitride semiconductor produced by the present techniques has good crystallinity. The semiconductor is easily peeled off from the growth substrate. The semiconductor may be naturally peeled off. The temperature of the substrate does not need to be raised or lowered in a period from the formation of the buffer layer to the formation of the semiconductor. That is, a Group III nitride semiconductor can be formed immediately after the formation of the high temperature growth buffer layer. Therefore, the process is simple, and the cycle time is short. There is no risk that impurities such as scandium are mixed in the semiconductor.

The present techniques, disclosed in the specification, provide a method for producing a Group III nitride semiconductor wherein a high quality high temperature growth buffer layer is formed and the growth substrate can be easily peeled off.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

With reference to the drawings, specific embodiments of the production method for producing a Group III nitride semiconductor, e.g., a Group III nitride semiconductor device, as an example will next be described in detail. However, these embodiments should not be construed as limiting the techniques thereto. The below-described depositing structure of the layers of the semiconductor device and the electrode structure are given only for the illustration purpose, and other depositing structures differing therefrom may also be employed. The thickness ratio of each of the layers shown in the drawings is not an actual value, but a conceptual value.

First Embodiment

1. First Semiconductor Device (Semiconductor Light-Emitting Device)

Figure 1:
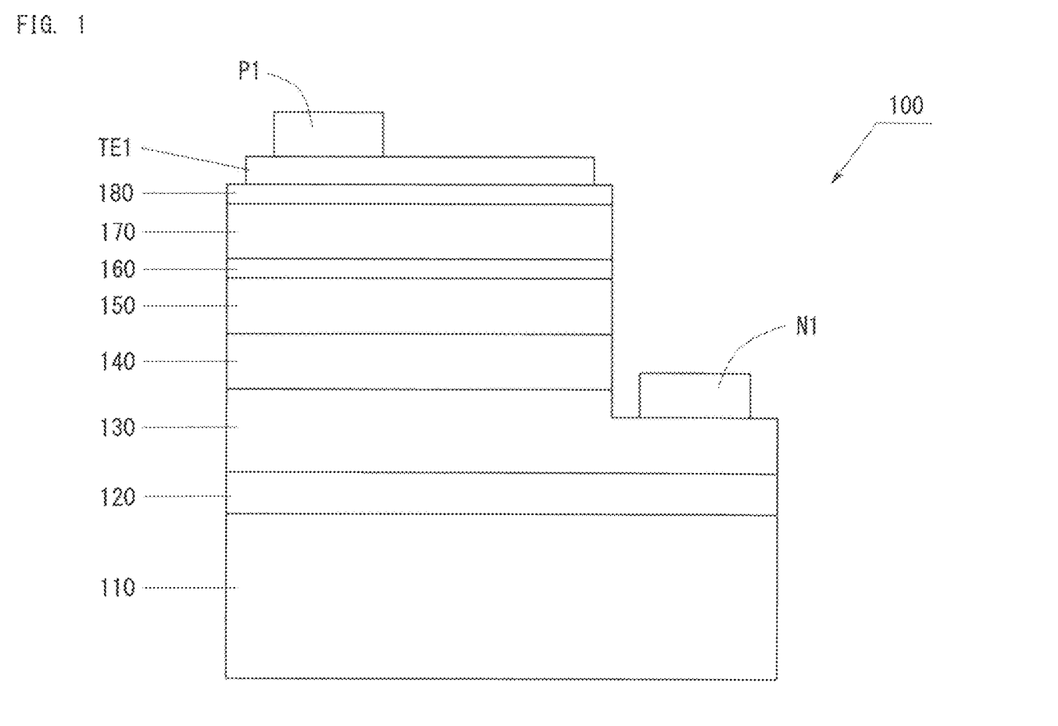
FIG. 1 is a schematic view of the structure of a semiconductor light-emitting device of a first embodiment.

FIG. 1 is a schematic view of the structure of a semiconductor light-emitting device 100 produced by a method of the first embodiment. The light-emitting device 100 is one peeled off from a growth substrate described after. The light-emitting device 100 is a face-up type semiconductor light-emitting device. The light-emitting device 100 has a plurality of Group III nitride semiconductor layers. As shown in FIG. 1, the light-emitting device 100 includes a base layer 110, i.e., a Group III nitride semiconductor, e.g., GaN, a GaN layer 120, an n-type contact layer 130, an n-side electrostatic breakdown-preventing layer 140, an n-side superlattice layer 150, a light-emitting layer 160, a p-side superlattice layer 170, a p-type contact layer 180, a transparent electrode TE1, a p-electrode P1, and an n-electrode N1.

The GaN layer 120, the n-type contact layer 130, the n-side electrostatic breakdown-preventing layer 140, the n-side superlattice layer 150, the light-emitting layer 160, the p-side superlattice layer 170, the p-type contact layer 180 are formed in this order on the main surface of the base layer 110. The n-electrode N1 is formed on the n-type contact layer 130. The p-electrode P1 is formed on the transparent electrode TE1. The n-type contact layer 130, the n-side electrostatic breakdown-preventing layer 140, and the n-side superlattice layer 150 are n-type semiconductor layers. The p-side superlattice layer 170 and the p-type contact layer 180 are p-type semiconductor layers. However, these layers may partially contain undoped layer. In this way, the light-emitting device 100 includes an n-type semiconductor layer, a light-emitting layer on the n-type semiconductor layer, an p-type semiconductor layer on the light-emitting layer, a transparent electrode TE1 on the p-type semiconductor layer, a p-electrode P1 on the transparent electrode TE1, and an n-electrode N1 on the n-type semiconductor layer.

The base layer 110 is a support layer to support semiconductor layers formed thereon. The base layer 110 is flat wherein the main surface and the surface opposite to the main surface are flat surfaces. The base layer 110 is made of GaN.

The GaN layer 120 is formed on the main surface of the base layer 110.

The n-type contact layer 130 is an n-type AlGaN (0≤Al<1) doped with Si. The n-type contact layer 130 is formed on the GaN layer 120. The n-type contact layer 130 is connected to the n-electrode N1.

The n-side electrostatic breakdown-preventing layer 140 is an electrostatic breakdown-preventing layer to prevent electrostatic breakdown of the semiconductor layer. The n-side electrostatic breakdown-preventing layer 140 is formed on the n-type contact layer 130. The n-side electrostatic breakdown-preventing layer 140 is formed by depositing, for example, an i-AlGaN layer comprising undoped i-AlGaN (0≤Al<1) and an n-type AlGaN layer comprising n-type AlGaN (0≤Al<1) doped with Si.

The n-side superlattice layer 150 is a strain relaxing layer to relax stress applied to the light-emitting layer 160. More specifically, the n-side superlattice layer 150 has a superlattice structure. The n-side superlattice layer 150 is formed by repeatedly depositing, for example, an InGaN (0≤In<1) layer and an n-type AlGaN (0≤Al<1) layer. Needless to say, the n-side superlattice layer 150 may contain other semiconductor layer such as AlGaN layer.

The light-emitting layer 160 emits light through recombination of electrons and holes. The light-emitting layer 160 is formed on the n-side superlattice layer 150. The light-emitting layer has at least a well layer and a barrier layer. The well layer may be, for example, an InGaN layer or a GaN layer. The barrier layer may be, for example, a GaN layer or an AlGaN layer. These are only examples, and other AlInGaN layer may be used.

The p-side superlattice layer 170 is formed on the light-emitting layer 160. The p-side superlattice layer 170 is a p-type cladding layer. The p-side superlattice layer 170 is formed by repeatedly depositing layer units, each including, for example, a p-type GaN layer, a p-type AlGaN layer, and a p-type InGaN layer deposited.

The p-type contact layer 180 is a semiconductor layer electrically connected to the p-electrode P1. Therefore, the p-type contact layer 180 is in contact with the p-electrode P1. The p-type contact layer 180 is formed on the p-side superlattice layer 170. The p-type contact layer 180 is, for example, a p-type AlGaN (0≤Al<1) layer doped with Mg.

The transparent electrode TE1 is formed on the p-type contact layer 180. The transparent electrode TE1 is made of ITO. Transparent conductive oxide such as IZO, ICO, ZnO, $TiO_2$, $NbTiO_2$, and $TaTiO_2$ may be used other than ITO.

The p-electrode P1 is formed on the transparent electrode TE1. The p-electrode P1 is electrically connected to the p-type contact layer 180 via the transparent electrode TE1. The p-electrode P1 is a metal electrode made of a metal such as Ni, Au, Ag, Co, and In.

The n-electrode N1 is formed on the n-type contact layer 130. The n-electrode N1 is in contact with the n-type contact layer 130. The n-electrode N1 is a metal electrode made of a metal such as Ni, Au, Ag, Co, and In.

2. Production Apparatus (Vapor Phase Deposition Apparatus)

Figure 2:
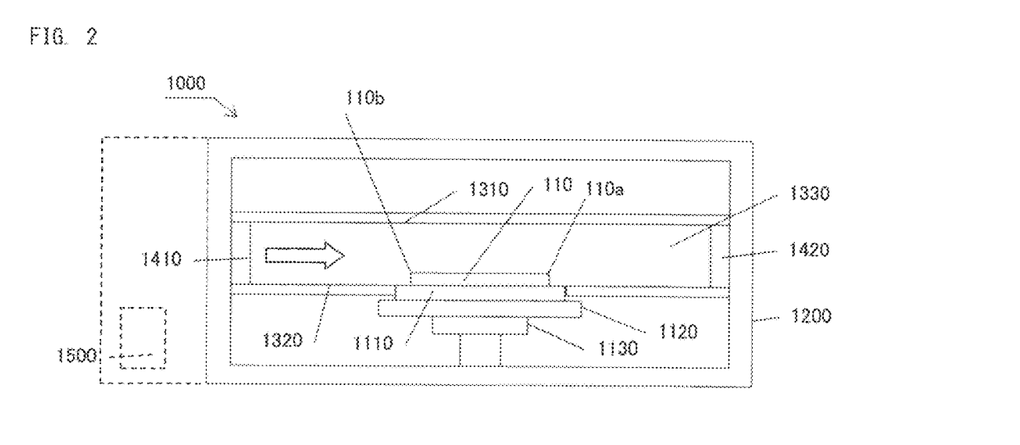
FIG. 2 is a schematic view of the structure of a production apparatus used in producing a semiconductor light-emitting device of the first embodiment.

FIG. 2 is a schematic view of the structure of a production apparatus 1000 of the first embodiment. The production apparatus 1000 is a MOCVD chamber to epitaxially grow the semiconductor layer on the growth substrate. The production apparatus 1000 is a variety of vapor phase deposition apparatus. The production apparatus 1000 includes a susceptor 1110, a heater 1120, a rotating shaft 1130, a chamber 1200, a nozzle 1410, a suction part 1420, and a controller 1500.

The susceptor 1110 is a support member to support a flat substrate S1, i.e., a growth substrate. Therefore, the flat substrate S1 can be disposed on the susceptor 1110. The heater 1120 is used for heating the flat substrate S1. The heater 1120 may be a contact type which is in contact with the susceptor 1110. The heater 1120 may be a non-contact type using radiant heat. The heater 1120 may be a non-contact type which directly heats the susceptor 1110 like induction heating. The rotating shaft 1130 is used for rotating the susceptor 1110. Thus, a semiconductor layer is grown on the flat substrate S1 while rotating the flat substrate S1.

The chamber 1200 is a chamber body. The nozzle 1410 is used for supplying carrier gas or raw material gas into the chamber 1200. When the production apparatus 1000 is used, the nozzle 1410 supplies gas toward the flat substrate S1 disposed on the susceptor 1110. The suction part 1420 is used for sucking gas from the inside of the chamber 1200.

Figure 3:
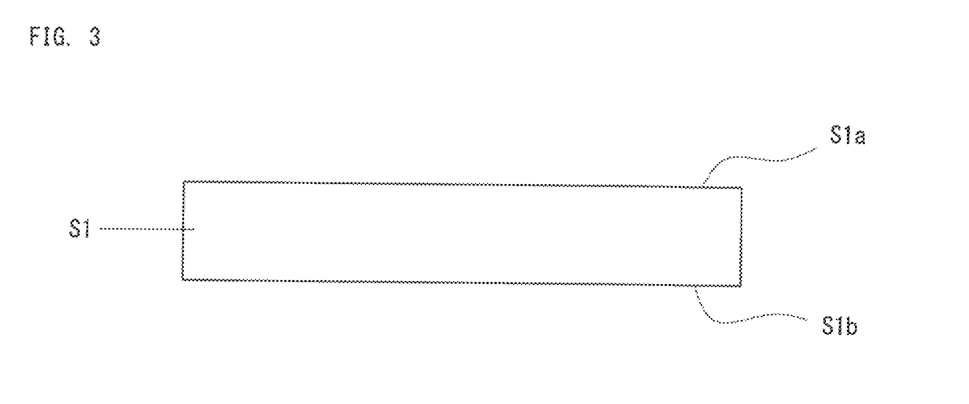
FIG. 3 is a view to describe a method for producing the semiconductor light-emitting device of the first embodiment (part 1)

The chamber 1200 has a top surface 1310 of flow passage, a bottom surface 1320 of flow passage, and side surfaces 1330 of flow passage. The top surface 1310 of flow passage, the bottom surface 1320 of flow passage, and the side surfaces 1330 of flow passage are for passing the gas supplied from the nozzle 1410 above the flat substrate S1 disposed on the susceptor 1110. As shown in FIG. 3, the production apparatus 1000 of the first embodiment sprays gas on the flat substrate S1 from a lateral direction. That is, the plate surface direction of the flat substrate S1 is parallel to the gas flow direction. Needless to say, the plate surface direction of the flat substrate S1 may cross the gas flow direction.

The controller 1500 is used for controlling parts of the production apparatus 1000. The controller 1500 serves as a flow rate controller to control the flow rate of carrier gas and raw material gas supplied from the nozzle 1410. The controller 1500 controls the temperature of the heater 1120 or the rotation of the rotating shaft 1130.

3. Production Method for Semiconductor Light-Emitting Device

A method of the first embodiment for producing a light-emitting device 100 is described here. The method for producing the light-emitting device 100 has a feature in forming an AlN buffer layer under which an Al layer or Al droplets remains as metal necessary for forming a base layer 110. In the first embodiment, crystals of semiconductor layer are epitaxially grown through metal-organic vapor phase epitaxy (MOCVD).

The production method includes a flat substrate preparation step of preparing a flat substrate, an Al layer or Al droplets formation step of forming the Al layer or Al droplets on the flat substrate, an AlN buffer layer formation step of forming the AlN buffer layer under which the Al layer or Al droplets remains as metal, a semiconductor layer formation step of forming a Group III nitride semiconductor as the base layer on the AlN buffer layer, and a peeling step of peeling the Group III nitride semiconductor from the flat substrate.

The carrier gas employed in the growth of semiconductor layers is hydrogen ($H_2$), nitrogen ($N_2$) or a mixture of hydrogen and nitrogen ($H_2+N_2$). In the steps being described later, unless otherwise specified, any of these may be employed. Ammonia gas ($NH_3$) is used as a nitrogen source. Trimethylgallium ($Ga(CH_3)_3$: "TMG") is used as a gallium source. Trimethylindium ($In(CH_3)_3$: "TMI") is used as an indium source. Trimethylaluminum ($Al(CH_3)_3$: "TMA") is used as an aluminum source. Silane ($SiH_4$) is used as an n-type dopant gas. Bis(cyclopentadienyl)magnesium (Mg $(C_5H_5)_2$) is used as a p-type dopant gas. Dimethylhydrazine (DMHy) may be used as a nitrogen precursor, i.e., a nitrogen source. Any nitrogen source gas can be used other than ammonia gas ($NH_3$).

A semiconductor layer is preferably grown under reduced pressure as needed. The lower the internal pressure during growth in the semiconductor production apparatus, the more the lateral growth of the semiconductor layer is accelerated. It is because migration of the raw material is accelerated on the surface of the substrate. Under a high temperature condition, migration of the raw material is further accelerated on the surface of the substrate.

3-1. Substrate Preparation Step

As shown in FIG. 3, in the substrate preparation step, a flat substrate S1 is prepared, wherein the main surface and the surface opposite to the main surface are flat surfaces. The flat substrate S1 has a first surface S1a and a second surface S1b. The first surface S1a is the main surface. The second surface S1b is the surface opposite to the first surface S1a. The first surface S1a and the second surface S1b are flat surfaces. The flat substrate S1 is made of sapphire. The substrate S1 is made of material different from a Group III nitride semiconductor. The substrate S1 may be made of, instead of sapphire, a material such as SiC, ZnO, or Si. The substrate is a growth substrate for growing the Group III nitride semiconductor thereon. The substrate is not necessary to be flat. The main surface may have an uneven structure with concaves and convexes.

3-2. Substrate Cleaning Step

Figure 6:
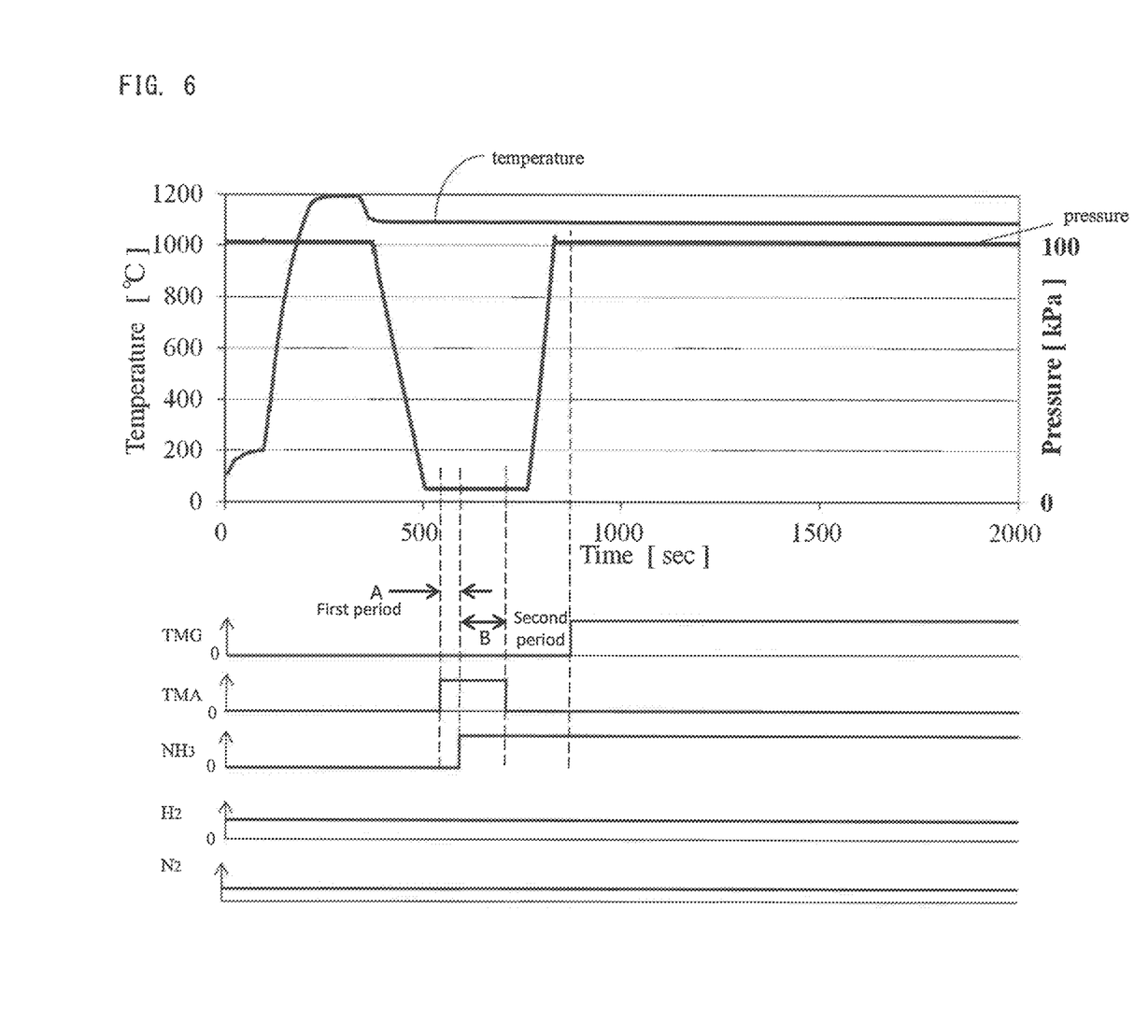
FIG. 6 is a timing chart of variations of temperature, pressure, and gas flows.

The flat substrate S1 is disposed on the susceptor 1110 of the production apparatus 1000. Subsequently, the temperature of the substrate is heated up to 1,000° C. or more as shown in FIG. 6. Hydrogen gas is supplied into the chamber 1200. Thus, the first surface S1a of the flat substrate S1 is cleaned and reduced. In this step, the internal pressure of the chamber 1200 is atmospheric pressure. However, the internal pressure of the chamber 1200 may be reduced pressure.

3-3. Al Layer or Al Droplets Formation Step (First Period A)

Figure 4:
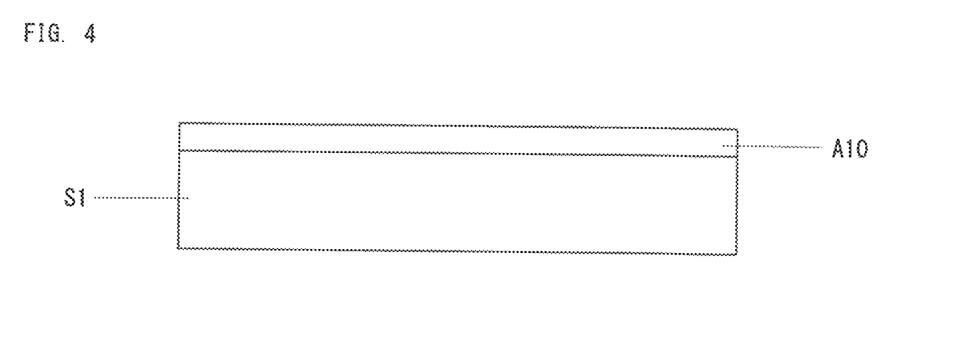
FIG. 4 is a view to describe the method for producing the semiconductor light-emitting device of the first embodiment (part 2)

As shown in FIG. 4, an Al layer A10 or Al droplets A10 is formed on the flat substrate S1. For that, the inside of the chamber 1200 of the production apparatus 1000 is depressurized as shown in FIG. 6. The internal pressure of the production apparatus 1000 is 1 kPa to 19 kPa, preferably, 1 kPa to 10 kPa. The temperature of the substrate is increased up to 900° C. to 1,500° C. as shown in FIG. 6. In the first period A under this condition, TMA is supplied, the supply of the $H_2$ and $N_2$ gases is continued, and $NH_3$ gas is not supplied as shown in FIG. 6. TMA is an organic metal gas containing Al. TMA is supplied at a rate of $1.0 \times 10^{-4}$ mol/min or more, more preferably $2.0 \times 10^{-4}$ mol/min or more, most preferably $3.0 \times 10^{-4}$ mol/min or more. An Al layer A10 is formed on the first surface S1a on the flat substrate S1. Or Al droplets A10 are formed on the surface of the flat substrate S1. In this way, an Al rich state is achieved on the surface of the flat substrate S1. This is because TMA is supplied at a high rate. The higher the growth temperature, the higher the reevaporation rate of Al. Therefore, the higher the supply rate of TMA, the better. However, the supply rate of TMA is actually $150 \times 10^{-4}$ mol/min or less, more preferably $50 \times 10^{-4}$ mol/min or less, more preferably $15 \times 10^{-4}$ mol/min or less. The supply rate of TMA is desirably set such that Al atoms are uniformly deposited on the entire surface of the substrate. In other word, the supply rate of TMA is desirably set such that Al atoms generated by decomposition of TMA can reach the entire surface from a near side 110b to a far side 110a of the substrate 110 in a gas flow direction and be deposited on the entire surface of the substrate.

The gas flow rate to the cross section area of the gas flow passage will be described. The flow rate of organic metal gas per cross sectional area perpendicular to the gas flow direction at the susceptor 1110 of the production apparatus 1000 is $1.0 \times 10^{-6}$ mol/(min·cm$^2$) to $150 \times 10^{-6}$ mol/(min·cm$^2$), preferably, $1.0 \times 10^{-6}$ mol/(min·cm$^2$) to $50 \times 10^{-6}$ mol/(min·cm$^2$), preferably, $1.0 \times 10^{-6}$ mol/(min·cm$^2$) to $15 \times 10^{-6}$ mol/(min·cm$^2$), more preferably, $2.0 \times 10^{-6}$ mol/(min·cm$^2$) to $10 \times 10^{-6}$ mol/(min·cm$^2$), and further preferably, $2.5 \times 10^{-6}$ mol/(min·cm$^2$) to $5.0 \times 10^{-6}$ mol/(min·cm$^2$). Here the area of the cross section is 100 cm$^2$.

3-4. AlN Buffer Layer Formation Step (Second Period B)

Figure 5:
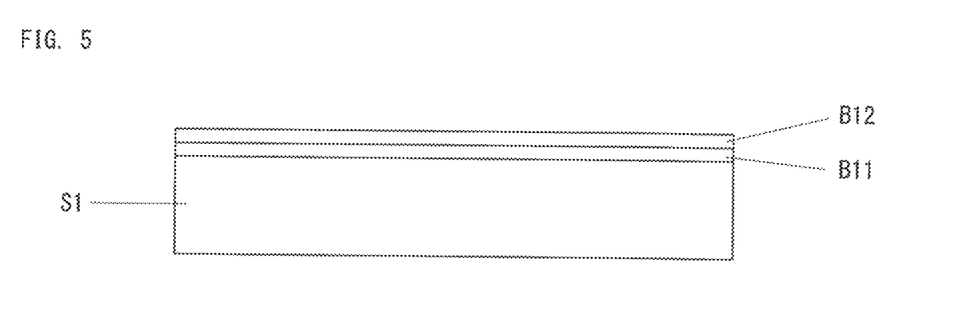
FIG. 5 is a view to describe the method for producing the semiconductor light-emitting device of the first embodiment (part 3)

$NH_3$ is supplied for the first time while continuing the supply of TMA in the second period B as shown FIG. 6. As shown in FIG. 5, the deep layer of the Al layer or Al droplets A10 disposed closer to the flat substrate S1 than the surface layer of the Al layer or Al droplets A10 remains as metal and becomes a metallic Al layer B11 by not being nitrided. That is, in this step, a bottom of the AlN buffer layer B12 is formed by nitriding the surface of the Al layer or Al droplets A10. In this step, the metallic Al layer B11 is formed, i.e., remains as metal, by not nitriding the deep layer of the Al layer or Al droplets A10. The metallic Al layer B11 is considered to have almost the same composition as that of the Al layer or Al droplets A10. The melting point of Al is in the vicinity of 660° C. Therefore, the metallic Al layer B11 is in a molten state. At this time, Al is easily vaporized under this condition.

In this step, the bottom surface of the AlN buffer layer B12 is formed by nitriding the surface of the Al layer already formed with the supply of $NH_3$. And a main body of the AlN buffer layer B12 is further formed with the supply of TMA and $NH_3$. Thus, the AlN buffer layer B12 having a thickness of 5 nm to 200 nm is formed. The thickness of the AlN buffer layer B12 is preferably 5 nm to 100 nm, more preferably, 5 nm to 50 nm. The temperature of the flat substrate S1 and the internal pressure in this step are the same as in the Al layer or Al droplets formation step. That is, the temperature of the substrate is 900° C. to 1,500° C. The internal pressure of the chamber 1200 is 1 kPa to 19 kPa. Through this step, the metallic Al layer B11 and the AlN buffer layer B12 are formed in this order on the flat substrate S1. The AlN buffer layer B12 is a high temperature growth AlN buffer layer.

3-5. Semiconductor Layer Formation Step

In this step, a Group III nitride semiconductor as the base layer is grown on the AlN buffer layer B12 with the metallic Al layer B11 kept in a molten state.

3-5-1. Base Layer Formation Step

Subsequently, the base layer 110 of GaN formed on the AlN buffer layer B12. The internal pressure of the chamber 1200 is raised to the atmospheric pressure, i.e. 100 kPa, as shown in FIG. 6. However, the internal pressure of the chamber 1200 in this process may be reduced pressure. The temperature of the flat substrate S1 at this time is in a range of 900° C. to 1,200° C. The temperature of the flat substrate S1 is preferably the same as that in the AlN buffer layer formation step. It is because the base layer 110 can be formed without waiting immediately after the formation of the AlN buffer layer B12. The internal pressure of the production apparatus 1000 may be reduced pressure or atmospheric pressure.

3-5-2. GaN Layer Formation Step

A GaN layer 120 is formed on the base layer 110. The temperature of the flat substrate S1 is in a range of 900° C. to 1,200° C. At this time, the internal pressure of the production apparatus 1000 is atmospheric pressure. However, it may be reduced pressure.

3-5-3. n-Type Contact Layer Formation Step

An n-type contact layer 130 is formed on the GaN layer 120. The temperature of the flat substrate S1 at this time is in a range of 900° C. to 1,200° C. The temperature of the flat substrate S1 is preferably the same as that in the AlN buffer layer formation step. It is because an n-type contact layer 130 can be formed without waiting immediately after the formation of the GaN layer 120. At this time, the internal pressure of the production apparatus 1000 is atmospheric pressure. However, it may be reduced pressure. Thus, the n-type contact layer 130 is formed.

3-5-4. n-Side Electrostatic Breakdown-Preventing Layer Formation Step

An n-side electrostatic breakdown-preventing layer 140 is formed on the n-type contact layer 130. The supply of silane ($SiH_4$) is stopped to form an i-AlGaN layer. At this time, the temperature of the substrate is in a range of 750° C. to 950° C. Silane ($SiH_4$) is supplied again to form an n-type AlGaN. At this time, the temperature of the substrate is the same as that at which the i-AlGaN layer is formed, that is, in a range of 750° C. to 950° C. The internal pressure of the production apparatus 1000 is atmospheric pressure. However, it may be reduced pressure.

3-5-5. n-Side Superlattice Layer Formation Step

An n-side superlattice layer 150 is formed on the n-side electrostatic breakdown-preventing layer 140. For example, the InGaN layer and the n-type GaN layer are repeatedly deposited. At this time, the temperature of the substrate is in a range of 700° C. to 950° C. The internal pressure of the production apparatus 1000 is atmospheric pressure. However, it may be reduced pressure.

3-5-6. Light-Emitting Layer Formation Step

A light-emitting layer 160 is formed on the n-side superlattice layer 150. For example, an InGaN layer, a GaN layer, and an AlGaN layer are repeatedly deposited. At this time, the temperature of the substrate is in a range of 700° C. to 900° C. The internal pressure of the production apparatus 1000 is atmospheric pressure. However, it may be reduced pressure.

3-5-7. p-Side Superlattice Layer Formation Step (p-Type Cladding Layer Formation Step)

A p-side superlattice layer 170 is formed on the light-emitting layer 160. For example, a p-type GaN layer, a p-type AlGaN layer, and a p-type InGaN layer are repeatedly deposited. Bis(cyclopentadienyl)magnesium ($Mg(C_5H_5)_2$) may be used as a dopant gas. At this time, the internal pressure of the production apparatus 1000 may be atmospheric pressure or reduced pressure.

3-5-8. p-Type Contact Layer Formation Step

Figure 7:
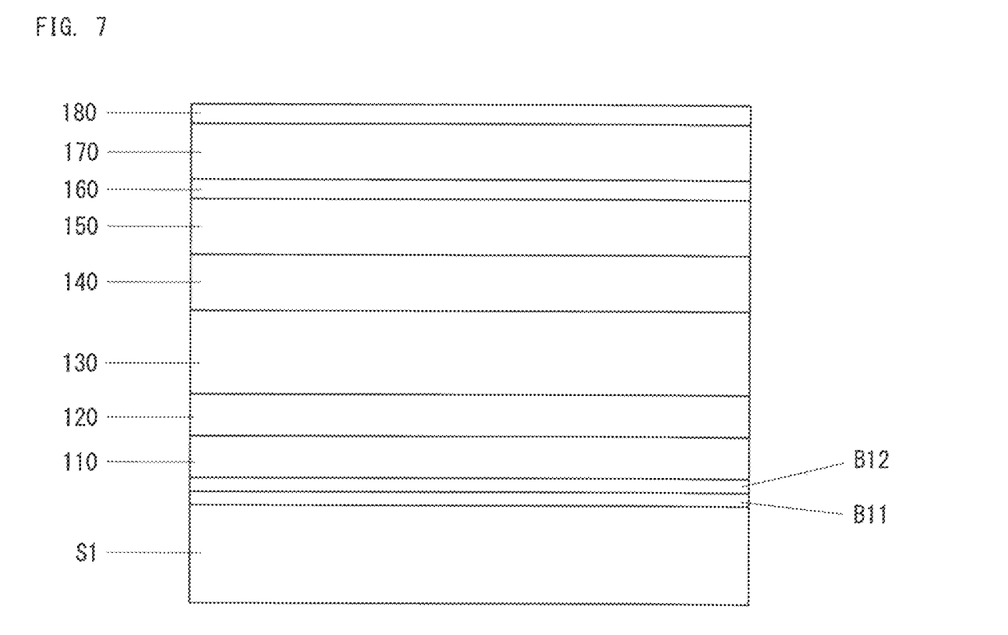
FIG. 7 is a view to describe the method for producing the semiconductor light-emitting device of the first embodiment (part 4)

A p-type contact layer 180 is formed on the p-side superlattice layer 170. At least hydrogen gas is supplied as a carrier gas. Thereby, the surface flatness of the p-type contact layer 180 is improved. The temperature of the flat substrate S1 is in a range of 800° C. to 1,200° C. Thus, as shown in FIG. 7, semiconductor layers are deposited on the flat substrate S1. At this time, the internal pressure of the production apparatus 1000 may be atmospheric pressure or reduced pressure.

3-6. Peeling Step (Cooling Step)

The temperature of the substrate S1 is cooled down to a room temperature. When the internal pressure of the production apparatus 1000 is in a depressurized condition, the internal pressure of the production apparatus 1000 is returned to atmospheric pressure. By cooling the temperature of the substrate S1 in this way, the metallic Al layer B11 is solidified when the temperature of the substrate S1 is in the vicinity of 660° C. However, the temperature at which the metallic Al layer B11 is solidified depends on the internal pressure of the chamber. The temperature of the substrate S1 is in the middle of returning from the vicinity of 660° C. to a room temperature, the base layer 110 of the Group III nitride semiconductor is naturally peeled off from the flat substrate S1 near an interface between the flat substrate S1 and the metallic Al layer B11. There is some large difference in thermal expansion coefficients between the flat substrate S1 and the Group III nitride semiconductor of the base layer 110. Therefore, a large stress is applied to an interface between the flat substrate S1 and the base layer 110, that is, the metallic Al layer B11. This stress ruptures the metallic Al layer B11, and the base layer 110 of the Group III nitride semiconductor is peeled off from the flat substrate S1. Even if the base layer 110 is not naturally peeled off from the flat substrate S1, the operator can easily separate them.

3-7. Transparent Electrode Formation Step

A transparent electrode TE1 is formed on the p-type contact layer 180. As the electrode formation techniques, sputtering or vapor deposition may be employed.

3-8. Electrode Formations Step

Figure 8:
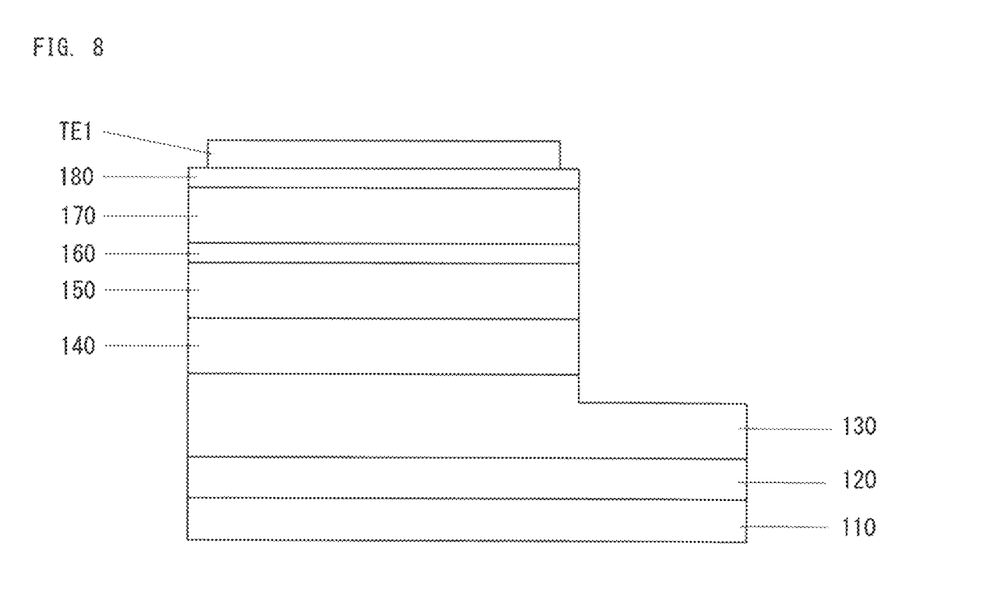
FIG. 8 is a view to describe the method for producing the semiconductor light-emitting device of the first embodiment (part 5)

As shown in FIG. 8, a part of the semiconductor layers is removed by laser processing or etching from the p-type contact layer 180 side thereby to expose the n-type contact layer 130. An n-electrode N1 is formed on the exposed portion. A p-electrode P1 is formed on the transparent electrode TE1. The p-electrode P1 formation step may be preceded or followed by the n-electrode N1 formation step.

3-9. Other Steps

In addition to the above-described steps, other steps including an insulation film formation step and a thermal treatment step may be carried out. Through the above, the light-emitting device 100 shown in FIG. 1 is produced.

Figure 9:
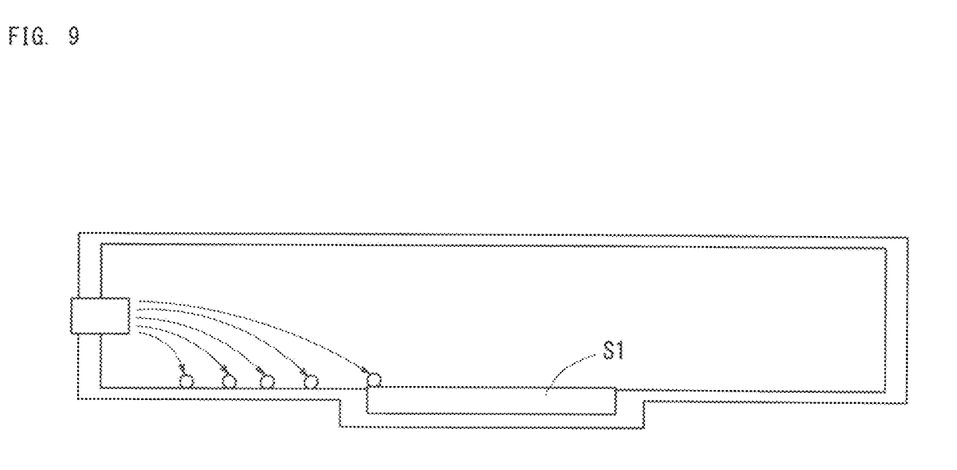
FIG. 9 is a view to describe the case when an organic metal gas containing Al is supplied to a substrate in the conventional techniques.

4. Comparison Between Techniques of First Embodiment and Conventional Techniques 4-1. Conventional Techniques TMA is easy to decompose at a high temperature. Therefore, as shown in FIG. 9, most Al atoms hardly reach the flat substrate S1 at high temperature. That is, most Al atoms are deposited and consumed on the susceptor or the inner wall of the chamber before the flat substrate S1. Even if the Al atoms reach the flat substrate S1, Al atoms are difficult to be uniformly supplied over the surface of the flat substrate S1. Therefore, it is extremely difficult to deposit the Al layer on the flat substrate S1.

In the conventional techniques, the organic metal gas containing Al is supplied at a rate of approximately $0.5 \times 10^{-4}$ mol/min.

4-2. Techniques of First Embodiments

In the first embodiment, the internal pressure of the chamber 1200 is set to 1 kPa to 19 kPa, the temperature of the substrate is set to 900° C. to 1,500° C., and an organic metal gas containing Al is supplied at a rate of $1.0 \times 10^{-4}$ mol/min or more. Since the internal pressure of the chamber 1200 is low, the mean free path of the gas in the chamber 1200 is long. Therefore, TMA reaches the position of the substrate 110 before consumption through decomposition.

Al easily evaporates under this environment. In the first embodiment, TMA is supplied at such a high rate that the supply rate of the gas containing Al atoms exceeds the evaporation rate of Al atoms. Therefore, the Al atoms are deposited on the first surface S1a of the flat substrate S1 before Al evaporates.

In the first embodiment, the film formation temperature of the metallic Al layer B11 and the AlN buffer layer B12 are almost the same as the film formation temperature of the Group III nitride semiconductor. Therefore, time to raise the temperature of the substrate S1 is not needed in a period from the formation of the AlN buffer layer B12 to the formation of the semiconductor layer. That is, the cycle time is short in the first embodiment.

The quality of the high temperature growth AlN buffer layer is more stable than the quality of the low temperature growth AlN buffer layer.

5. Modifications 5-1. Material of Base Layer

The material of the base layer 110 is GaN. However, the material of the base layer 110 may be AlGaN, AlN, AlInGaN, or InGaN.

5-2. Flip-Chip

The light-emitting device 100 produced by the method of the first embodiment is a face-up type light-emitting device. However, the techniques of the specification are applicable to a flip-chip type light-emitting device.

5-3. Deposition Structure

The semiconductor layer may have any deposition structure other than the above. For example, the GaN layer 120 may be omitted. In the case of ultraviolet light-emitting device, the n-side electrostatic breakdown-preventing layer 140 may be omitted.

5-4. Combination

The above-described modifications may be used in any combination.

6. Summary of First Embodiment

As described above in detail, in the method of the first embodiment for producing a light-emitting device 100, an Al layer A10 is formed on a flat substrate S1, and an AlN buffer layer B12 is formed while nitriding the surface of the Al layer A10. The metallic Al layer B11 is formed by not nitriding the deep layer of the Al layer A10. The AlN buffer layer B12 is a high temperature growth AlN buffer layer grown at a high temperature. The high temperature growth AlN buffer layer has a stable quality. Therefore; a semiconductor light-emitting device excellent in quality is achieved. There is no need to raise and lower the temperature of the substrate in a period from the formation of the Al layer or Al droplets and the AlN buffer layer to the formation of the semiconductor layer. Thus, the cycle time is short in this production method.

The aforementioned embodiments are merely examples. Thus, needless to say, various modifications and variations can be made, so long as they fall within the scope of the present technique. The layered structure of the layered body should not be limited to those as illustrated, and the layered structure, the thickness, etc. may be arbitrarily chosen.

Second Embodiment

A second embodiment will be described.
1. Second Semiconductor Device (HEMT)

Figure 10:
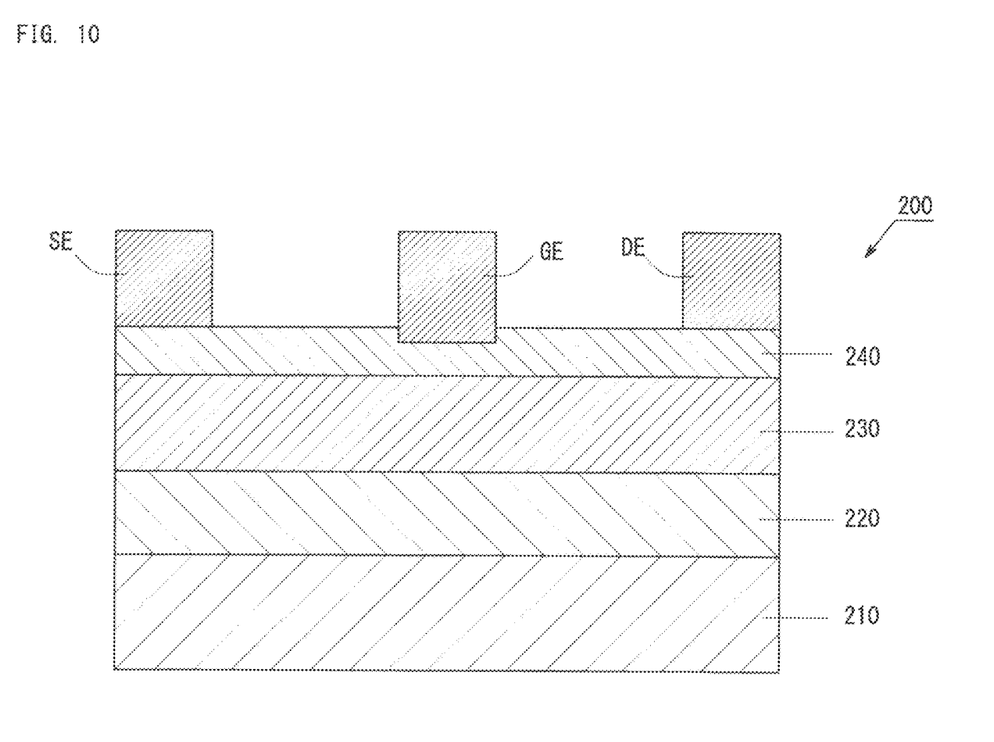
FIG. 10 is a schematic view of a HEMT of a second embodiment.

FIG. 10 is a schematic view of a HEMT 200 of a second embodiment. The HEMT 200 includes a GaN base layer 210, an underlayer 220, a carrier traveling layer 230, a carrier supplying layer 240, a gate electrode GE, a source electrode SE, and a drain electrode DE. The source electrode SE and the drain electrode DE are formed on the carrier supplying layer 240. The GaN base layer 210 is the layer formed on the substrate S1 as same as the first embodiment.

The underlayer 220 is, for example, a GaN layer. The carrier traveling layer 230 is, for example, a GaN layer. The carrier supplying layer 240 is, for example, an AlGaN layer.

The techniques of the first embodiment are applicable to a semiconductor device using such a Group III nitride semiconductor. They are also applicable to other semiconductor device such as IGBT and MOSFET.

Third Embodiment

A third embodiment will be described. In the third embodiment, a substrate is produced without producing a semiconductor device as in the first and second embodiments.
1. Substrate Production Method The substrate production method includes a flat substrate preparation step of preparing a flat substrate, an Al layer or Al droplets formation step of forming an Al layer or Al droplets on the flat substrate, an AlN buffer layer formation step of forming an AlN buffer layer under which the Al layer or Al droplets remains as a metal state, a substrate formation step of forming a Group III nitride semiconductor as a base layer on the AlN buffer layer, and a peeling step of peeling the base layer of Group III nitride semiconductor from the flat substrate. The base layer peeled off becomes the substrate of Group III nitride semiconductor. The substrate can be used as a growth substrate for forming devices. For example, the substrate can be used as a growth substrate for a light-emitting device and other devices. And the substrate can be used as a semiconductor material. Other production conditions are the same as in the first embodiment.

Experiment
1. Substrate

A sapphire substrate was used as a flat substrate.
2. Formation of AlN Buffer Layer A high temperature growth AlN buffer layer was formed on a flat substrate in a MOCVD chamber. The temperature of the substrate was 1,080° C. The internal pressure of the chamber was 4 kPa. Under this condition, firstly, TMA was supplied without supplying $NH_3$. The supply rate of TMA was $1.2 \times 10^{-4}$ mol/min. TMA was supplied for two minutes.

Figure 11:
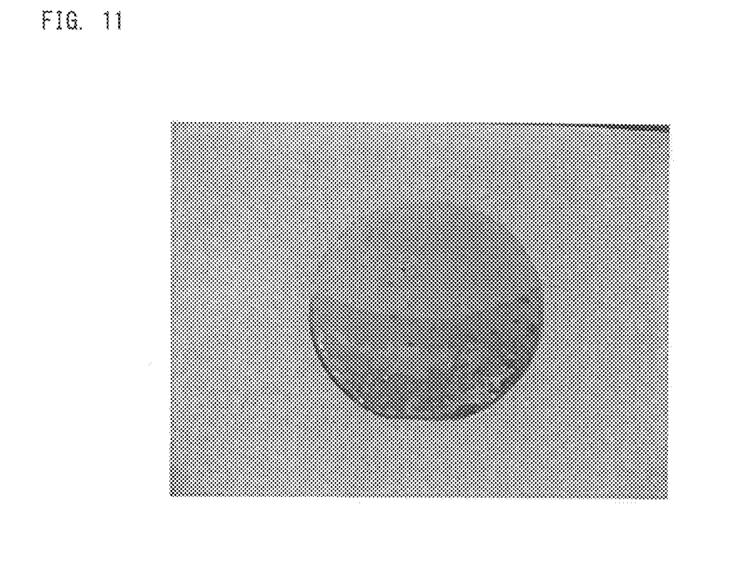
FIG. 11 is a photo showing the surface of a GaN layer in experiment.

Then, an AlN buffer layer was formed by supplying $NH_3$ while continuing the supply of TMA. TMA and $NH_3$ were supplied for two minutes.
3. Formation of Semiconductor Layer After that, the internal pressure of the chamber was raised to one atmospheric pressure without changing the temperature of the substrate. A GaN layer, i.e., a base layer, having a thickness of 2 μm was formed on the high temperature growth AlN buffer layer. Subsequently, the temperature of the substrate was raised to 1,150° C. to flatten the GaN layer. Moreover, a GaN layer having a thickness of 4 μm was formed.
4. Photo FIG. 11 is a photo showing the surface of a GaN layer in the experiment. As shown in FIG. 11, a black portion (embodiment) and an almost transparent portion (modification) are formed on a wafer. The black portion is a region where a metallic Al layer is formed. The almost transparent portion is a region where a metallic Al layer is not formed. The almost transparent portion is a region where Al atoms were not formed as shown in FIG. 9. In the black portion, the GaN layer is naturally peeled off from the growth substrate.
5. Voids on Metallic Al Layer Voids formed on the metallic Al layer B11 will be described. As described above, a metallic Al layer B11 and an AlN buffer layer B12 were sequentially formed on the sapphire substrate. A Group III nitride semiconductor layer was formed on the AlN buffer layer B12. When the sample is viewed with a transmission electron microscope (TEM), voids were observed inside the metallic Al layer B11.

It is considered that the voids were formed in a period after starting the formation of the Al layer or Al droplets A10 till finishing the formation of the AlN buffer layer B12. It is considered that Al atoms gradually starts evaporating after the formation of the Al layer or Al droplets A10, and evaporation is stopped when the formation of the AlN buffer layer B12 is finished. Since the AlN buffer layer B12 is sufficiently thin, it is considered that Al atoms can pass through the AlN buffer layer B12 and evaporate. However, after the formation of the semiconductor layer, Al atoms are unlikely to pass through the semiconductor layer and evaporate.

Figure 12:
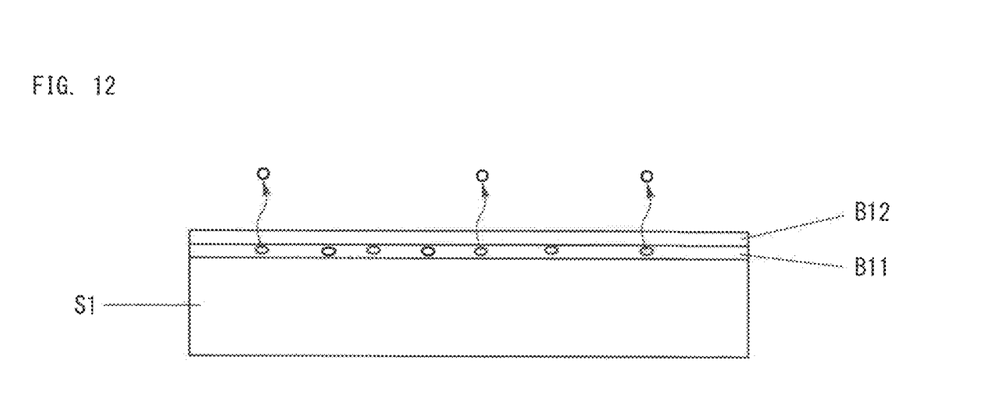
FIG. 12 is a view showing voids occurring inside a metal Al layer in the production process for a semiconductor light-emitting device.

As shown in FIG. 12, in at least one of the Al layer or Al droplets formation step and the AlN buffer layer formation step, voids are formed in the Al layer or Al droplets by evaporating the Al atoms from the Al layer or Al droplets. Actually, it is considered that Al atoms pass through the AlN buffer layer B12 in process of formation and evaporate, thereby forming voids inside the metallic Al buffer layer B11. Even at an initial stage of growth of the semiconductor layer, voids may be grown. Since such voids exist, the Group III nitride semiconductor layer is more easily peeled off from the flat substrate S1.

What is claimed is:

1. A method for producing a Group III nitride semiconductor, the method comprising:
   forming an Al layer or Al droplets on a surface of a substrate, which is made of a material different from the Group III nitride semiconductor, by flowing an organic metal gas containing Al without flowing an ammonia gas;
   forming an AlN buffer layer on the Al layer or Al droplets by flowing the organic metal gas containing Al and the ammonia gas, the Al layer or Al droplets remaining as a metal under the AlN buffer layer;
   forming the Group III nitride semiconductor on the AlN buffer layer; and peeling the Group III nitride semiconductor in a place of the Al layer or Al droplets remaining as the metal from the substrate on account that the metal is ruptured by a stress applied to the metal.

2. The method for producing a Group III nitride semiconductor according to claim 1, wherein the Group III nitride semiconductor is naturally peeled off from the substrate when the substrate is taken out of a vapor phase deposition apparatus.

3. The method for producing a Group III nitride semiconductor according to claim 1, wherein voids are formed in the Al layer or Al droplets by evaporating Al atoms from the Al layer or Al droplets.

4. The method for producing a Group III nitride semiconductor according to claim 2, wherein voids are formed in the Al layer or Al droplets by evaporating Al atoms from the Al layer or Al droplets.

5. A method for producing a Group III nitride semiconductor, the method comprising:
   forming an Al layer or Al droplets on a surface of a substrate, which is made of a material different from the Group III nitride semiconductor, by flowing an organic metal gas containing Al without flowing an ammonia gas;
   forming an AlN buffer layer on the Al layer or Al droplets by flowing the organic metal gas containing Al and the ammonia gas, the Al layer or Al droplets remaining as a metal under the AlN buffer layer;
   forming the Group III nitride semiconductor on the AlN buffer layer; and
   peeling the Group III nitride semiconductor in a place of the Al layer or Al droplets from the substrate,
   wherein in the forming the Al layer or Al droplets, the internal pressure of a vapor phase deposition apparatus is set to 1 kPa to 19 kPa, the temperature of the substrate is set to 900° C. to 1,500° C., and an organic metal gas containing Al is supplied at a flow rate such that Al atoms are uniformly deposited on an entire surface of the substrate.

6. The method for producing a Group III nitride semiconductor according to claim 5, wherein the Group III nitride semiconductor is naturally peeled off from the substrate when the substrate is taken out of a vapor phase deposition apparatus in the forming the Al layer or Al droplets.

7. The method for producing a Group III nitride semiconductor according to claim 5, wherein voids are formed in the Al layer or Al droplets by evaporating Al atoms from the Al layer or Al droplets.

8. The method for producing a Group III nitride semiconductor according to claim 5, wherein the organic metal gas containing Al is supplied at a flow rate such that Al atoms generated by decomposition of the organic metal gas containing Al can reach the entire surface from a near side to a far side of the substrate in a gas flow direction.

9. The method for producing a Group III nitride semiconductor according to claim 1, wherein in the forming the Group III nitride semiconductor, the internal pressure of the furnace is set at an atmospheric pressure.

10. The method for producing a Group III nitride semiconductor according to claim 5, wherein in the forming the AlN buffer layer, the internal pressure of the vapor phase deposition apparatus, the temperature of the substrate and the flow rate of the organic metal gas containing Al are kept at values as same as values at which the Al layer or Al droplets is formed.

11. The method for producing a Group III nitride semiconductor according to claim 10, wherein in the forming the Group III nitride semiconductor, the internal pressure of the furnace is set at an atmospheric pressure.

12. A method for producing a Group III nitride semiconductor, the method comprising:
    forming an Al layer or Al droplets on a surface of a substrate, which is made of a material different from the Group III nitride semiconductor, by flowing an organic metal gas containing Al without flowing an ammonia gas;
    forming an AlN buffer layer on the Al layer or Al droplets by flowing the organic metal gas containing Al and the ammonia gas, the Al layer or Al droplets remaining as a metal under the AlN buffer layer;
    forming the Group III nitride semiconductor on the AlN buffer layer; and
    peeling the Group III nitride semiconductor in a place of the Al layer or Al droplets from the substrate,
    wherein the Group III nitride semiconductor is grown on the AlN buffer layer while the Al layer or Al droplets is kept in a molten state.

13. The method for producing a Group III nitride semiconductor according to claim 5, wherein in the forming the Al layer or Al droplets, the organic metal gas containing Al is supplied at any rate in a range from $1.0 \times 10^{-4}$ mol/min to $150 \times 10^{-4}$ mol/min.

14. The method for producing a Group III nitride semiconductor according to claim 5, wherein in the forming the Al layer or Al droplets, the flow rate of the organic metal gas per the area of the cross section perpendicular to a gas flow direction at a position of the substrate is set at any value in a range from $1.0 \times 10^{-6}$ mol/(min cm$^2$) to $10 \times 10^{-6}$ mol/(min·cm$^2$).

15. The method for producing a Group III nitride semiconductor according to claim 1, wherein the Group III nitride semiconductor which is grown on the AlN buffer layer is a light-emitting device.

16. The method for producing a Group III nitride semiconductor according to claim 1, wherein the Group III nitride semiconductor which is peeled off the substrate is another substrate for a device.

* * * * *